United States Patent
Kang et al.

(10) Patent No.: US 12,454,522 B2
(45) Date of Patent: Oct. 28, 2025

(54) PREPARATION AND USE OF TETRADENTATE PLATINUM(II) COMPLEX

(71) Applicant: GUANGDONG AGLAIA OPTOELECTRONIC MATERIALS CO., LTD, Guangdong (CN)

(72) Inventors: Jian Kang, Foshan (CN); Lei Dai, Foshan (CN); Lifei Cai, Foshan (CN)

(73) Assignee: GUANGDONG AGLAIA OPTOELECTRONIC MATERIALS CO., LTD, Foshan (CN)

( * ) Notice: Subject to any disclaimer, the term of this patent is extended or adjusted under 35 U.S.C. 154(b) by 598 days.

(21) Appl. No.: 17/926,976

(22) PCT Filed: May 9, 2021

(86) PCT No.: PCT/CN2021/092522
§ 371 (c)(1),
(2) Date: Nov. 21, 2022

(87) PCT Pub. No.: WO2021/233147
PCT Pub. Date: Nov. 25, 2021

(65) Prior Publication Data
US 2023/0209991 A1   Jun. 29, 2023

(30) Foreign Application Priority Data
May 21, 2020   (CN) .......................... 202010438251.3

(51) Int. Cl.
| C07F 15/00 | (2006.01) |
| C07D 401/14 | (2006.01) |
| C09K 11/06 | (2006.01) |
| H01L 51/00 | (2006.01) |
| H10K 85/00 | (2023.01) |
| H10K 85/30 | (2023.01) |
| H10K 50/12 | (2023.01) |

(52) U.S. Cl.
CPC ........ *C07D 401/14* (2013.01); *C07F 15/0086* (2013.01); *C09K 11/06* (2013.01); *H10K 85/00* (2023.02); *H10K 85/346* (2023.02); *C09K 2211/1059* (2013.01); *C09K 2211/185* (2013.01); *H10K 50/12* (2023.02)

(58) Field of Classification Search
CPC .......................... C07F 15/0086; H10K 50/10
USPC ............................................. 546/10; 313/504
See application file for complete search history.

(56) References Cited

U.S. PATENT DOCUMENTS
2019/0135844 A1   5/2019   Jeon et al.

FOREIGN PATENT DOCUMENTS
| CN | 107163087 A | 9/2017 |
| CN | 108299503 A | 7/2018 |
| WO | 2014047616 A1 | 3/2014 |

*Primary Examiner* — Charanjit Aulakh
(74) *Attorney, Agent, or Firm* — Maschoff Brennan

(57) ABSTRACT

The present invention relates to preparation and application of a novel quadridentate platinum (II) complex, and belongs to the field of OLED organic electroluminescent materials. The complex of the present invention has NCNC chelating coordination, a stable structure, a spiro ring structure in the skeleton, a strong molecular stereoscopic property, and weak intermolecular interaction, so that mutual stacking between complex molecules is avoided, the formation of an excimer is greatly inhibited, and thus the efficiency of an OLED device is improved. The complex of the present invention has high fluorescence quantum efficiency, great thermal stability and low quenching constant, and can be used for manufacturing a red-light OLED device with high luminescence efficiency and low roll-off.

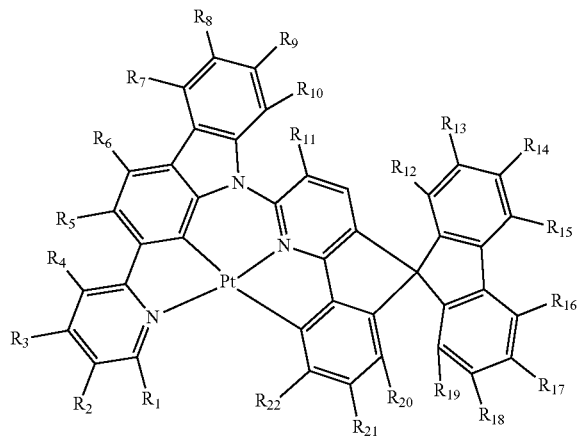

12 Claims, 1 Drawing Sheet

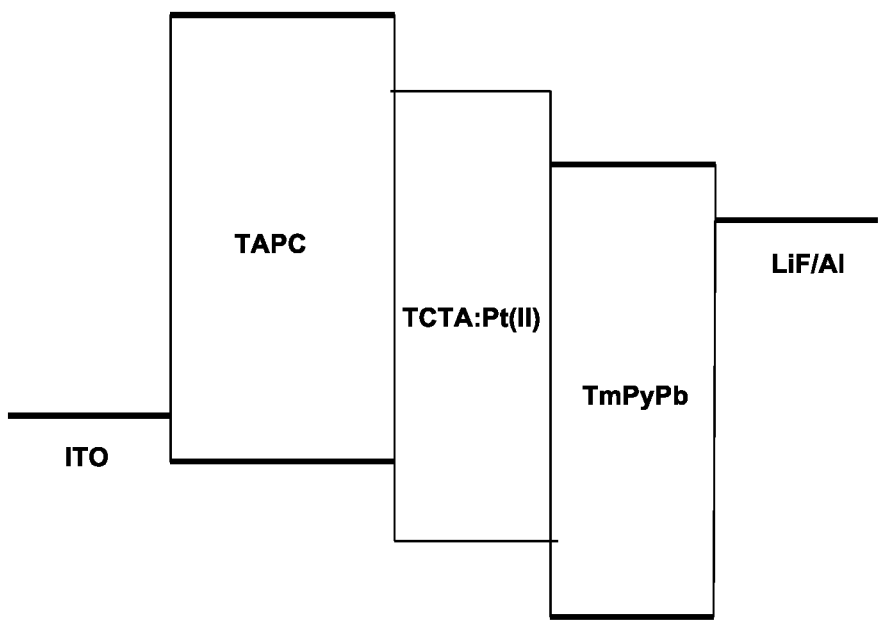

PREPARATION AND USE OF TETRADENTATE PLATINUM(II) COMPLEX

TECHNICAL FIELD

The present invention relates to a novel quadridentate platinum (II) complex metal-organic material, especially a phosphorescent doping material with a photon emission effect in a light-emitting layer of an OLED light-emitting device.

BACKGROUND

An organic light-emitting diode (OLED), also known as organic electroluminesence display and organic light-emitting semiconductor, was discovered by a Chinese-American professor Ching W. Tang in a laboratory in 1987. A device with a "sandwich" structure was manufactured by Ching W. Tang et al. with ITO as an anode, magnesium and aluminum as a cathode, aromatic diamine (75 nm) as a hole transport layer, and 8-hydroxyquinoline aluminum (60 nm) as an electron transport layer and a light-emitting layer. It was observed that the device had a high-brightness green-light emission with a brightness of 1,000 $cd/m^2$, a current efficiency of 3 cd/A, an external quantum efficiency of 1%, and a power efficiency of 1.51 lm/W at a voltage of about 5 V. According to the device with such sandwich structure, properties are significantly improved, milestone significance for the development and application of organic electroluminescence in the future is achieved, a new era in organic optoelectronic research is opened, and a direction is provided for organic electroluminescence research.

As the latest display technology, the OLED has a broad development prospect. The OLED display technology is developed after CRT and LCD, and has self-luminous properties, no backlight source, high visibility and brightness, wide viewing angle, and rapid response. A material has a light weight, a low thickness, and a superior property of flexible display. Meanwhile, compared with the LCD, the OLED has low voltage demand, low component demand, and low cost. The OLED has excellent properties. In particular, the OLED has been gradually applied in directions such as large size, curved surface, and flexibility in recent years, and will be widely applied in the fields of smart phones, televisions, wearable devices, and VR in the future. Thus, the OLED has a broad development prospect.

The development of the OLED display technology is arduous and significant research. The OLED not only has great features, but also has shortcomings such as short service life, low color purity, and easy aging, so that the application of the OLED technology in a large scale is limited. Therefore, the design of a novel OLED material with excellent properties, especially a doping material for a light-emitting layer, has become the focus and difficulty in the research of the OLED field. In current OLED materials, transition metal phosphorescent materials are mainly used for doping in a light-emitting layer to achieve a photon emission effect, in which complexes based on iridium (III) and platinum (II) are mostly studied. In generally, a metal complex formed by a bidentate ligand and trivalent iridium has an octahedral coordination structure, and iridium atoms in the octahedral center have chelating coordination with the bidentate ligand. Due to the octahedral coordination structure of an iridium (III) complex, a strong molecular stereoscopic property is achieved, and mutual stacking between complex molecules is avoided. When the complex is doped at high concentration in the process of preparing an OLED device, an excimer for luminescence is difficult to form. However, when some asymmetric bidentate ligands are used, isomers of the iridium (III) complex may be produced. Since the ligands have different coordination orientations, a planar structure and a meridian structure may be caused, so that the difficulty in separating the iridium (III) complex is increased, and the yield of the target iridium (III) complex is decreased.

While iridium (III) complex phosphorescent materials have made breakthroughs continuously, platinum (II)-based phosphorescent OLED materials have been gradually developed and achieved good research results in recent years. Different from the common iridium (III) forming the octahedral coordination structure, the platinum (II) has tetrahedral coordination, so that a complex with a planar structure is generally formed. Common ligands mainly include a bidentate ligand, a tridentate ligand, and a quadridentate ligand. Compared with the bidentate ligand and the tridentate ligand, a quadridentate ligand platinum (II) complex has the following advantages.

1) The platinum (II) complex can be synthesized by a reaction of the ligand in one step, so that the platinum (II) complex is easy to prepare and purify.

2) In the process of synthesizing the platinum (II) complex, no isomers are produced, and a specific structure is achieved.

3) Chelating coordination and a stable structure are achieved.

4) Relatively great phosphorescence emission efficiency is achieved.

Due to unique properties, the quadridentate ligand platinum (II) complex has attracted much research and attention. In particular, the research group of Academician Zhi Zhiming of the University of Hong Kong, has conducted in-depth research on such complex and achieved great results (*Chem. Sci.* 2016, 7, 1653).

SUMMARY

This application provides a novel Pt (II) complex based on a quadridentate ligand. The complex has a red-light emission, and is used as a red-light phosphorescent OLED material in an OLED device. The novel Pt (II) complex has an NCNC chelating coordination model, and a spiro ring structure in the molecular skeleton. Due to such structure, a molecular stereoscopic property is greatly improved, the reduction of intermolecular interaction is facilitated, the stacking between complex molecules is avoided, the formation of an excimer is inhibited, and the efficiency and service life of an OLED device are improved.

The novel quadridentate platinum (II) complex metal-organic material involved in the present invention has the structure as shown in the following formula:

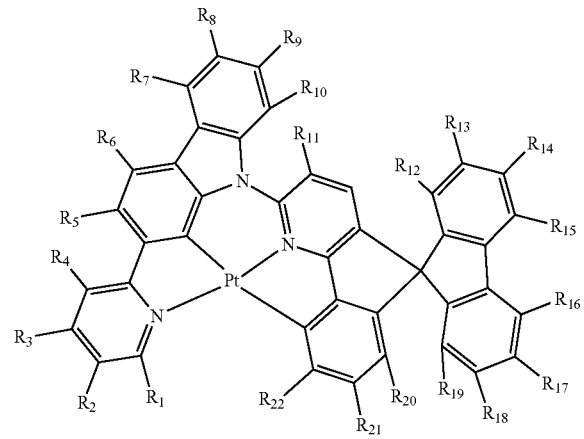

where $R_1$-$R_{22}$ are independently selected from hydrogen, deuterium, sulfur, halogen, hydroxyl, acyl, alkoxy, acyloxy, amino, nitro, acyl amino, cyano, carboxyl, styryl, amino carbonyl, carbamoyl, benzyl carbonyl, aryloxy, diarylamino, silyl containing 1-30 C atoms, saturated alkyl containing 1-30 C atoms, unsaturated alkyl containing 2-20 C atoms, substituted or unsubstituted aryl containing 5-30 C atoms, and substituted or unsubstituted heteroaryl containing 5-30 C atoms; or adjacent $R_1$-$R_{22}$ are mutually connected into a ring by a covalent bond; the substituted refers to substitution with halogen, deuterium, $C_1$-$C_{20}$ alkyls, and cyano; and a heteroatom in the heteroaryl includes one or more of N, O, and S.

Preferably, the $R_1$-$R_{22}$ are independently selected from hydrogen, halogen, amino, nitro, cyano, diarylamino, saturated alkyl containing 1-10 C atoms, aryl containing 5-20 C atoms unsubstituted or substituted with halogen or one or more of $C_1$-$C_4$ alkyls, and heteroaryl containing 5-20 C atoms unsubstituted or substituted with halogen or one or more of $C_1$-$C_4$ alkyls; or adjacent $R_1$-$R_{22}$ are mutually connected into a ring by a covalent bond; and the halogen includes F, Cl, and Br.

Preferably, among 22 groups, namely the $R_1$-$R_{22}$, 0-3 groups are independently represented as diarylamino, aryl containing 5-10 C atoms unsubstituted or substituted with halogen or 1-3 $C_1$-$C_4$ alkyls, and N-heteroaryl containing 5-10 C atoms unsubstituted or substituted with halogen or 1-3 $C_1$-$C_4$ alkyls; the other groups are independently represented as hydrogen or saturated alkyl containing 1-8 C atoms; and the halogen includes F and Cl.

Preferably, among the 22 groups, namely the $R_1$-$R_{22}$, 0-3 groups are independently represented as diphenylamino, phenyl unsubstituted or substituted with halogen or 1-3 $C_1$-$C_4$ alkyls, pyridyl unsubstituted or substituted with halogen or 1-3 $C_1$-$C_4$ alkyls, and carbazolyl unsubstituted or substituted with halogen or 1-3 $C_1$-$C_4$ alkyls; and the other groups are independently represented as hydrogen, fluorine, or saturated alkyl containing 1-4 C atoms.

A preferred structure is shown in the following formula:

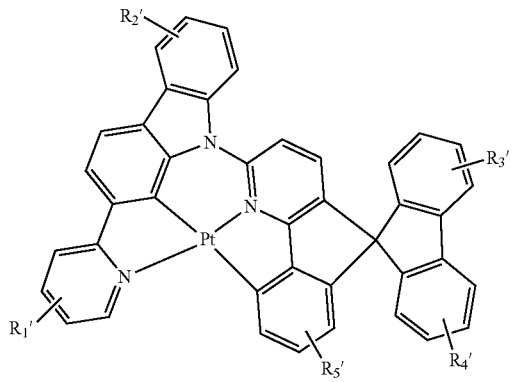

where $R_1'$-$R_5'$ are independently selected from hydrogen, halogen, diarylamino, saturated alkyl containing 1-10 C atoms, aryl containing 5-20 C atoms unsubstituted or substituted with halogen or one or more of $C_1$-$C_4$ alkyls, and heteroaryl containing 5-20 C atoms unsubstituted or substituted with halogen or one or more of $C_1$-$C_4$ alkyls; or adjacent $R_1'$-$R_5'$ are mutually connected into a ring by a covalent bond; the halogen includes F, Cl, and Br; and a heteroatom in the heteroaryl includes any one of N, O, and S.

Preferably, among 5 groups, namely the 0-3 groups are independently represented as diarylamino, aryl containing 5-10 C atoms unsubstituted or substituted with halogen or 1-3 $C_1$-$C_4$ alkyls, and heteroaryl containing 5-10 C atoms unsubstituted or substituted with halogen or 1-3 $C_1$-$C_4$ alkyls; the other groups are independently represented as hydrogen, halogen, or saturated alkyl containing 1-8 C atoms; and the halogen includes F and Cl.

Preferably, among the 5 groups, namely the $R_1'$-$R_5'$, 0-3 groups are independently represented as diphenylamino, phenyl unsubstituted or substituted with $C_1$-$C_4$ alkyls, pyridyl, and carbazolyl; and the other groups are independently represented as hydrogen, fluorine, and saturated alkyl containing 1-4 C atoms.

A precursor of the above complex is shown in the following formula:

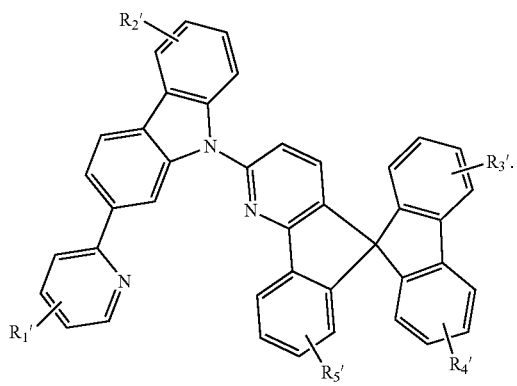

In order to achieve the objective of the application, unless otherwise specified, the terms halogen, alkyl, alkenyl, aryl, acyl, alkoxy, and heterocyclic aromatic systems or heterocyclic aromatic groups may have the following meanings.

The above-mentioned halogen or halide includes fluorine, chlorine, bromine, and iodine, preferably F, Cl, and Br, more preferably F or Cl, and most preferably F.

The above-mentioned ring, aryl, or heteroaryl connected by a covalent bond includes aryl containing 5-30 carbon atoms, preferably 5-20 carbon atoms, and more preferably 5-10 carbon atoms and consisting of an aromatic ring or multiple condensed aromatic rings. For example, the suitable aryl includes phenyl, naphthyl, acenaphthenyl, acenaphthenyl, anthryl, fluorenyl, and phenalenyl. The aryl may be unsubstituted (that is to say, all carbon atoms that can be substituted have hydrogen atoms) or substituted at one, more, or all of substitutable positions. For example, a suitable substituent includes halogen, preferably F, Br, or Cl. The alkyl preferably includes alkyl containing 1-20, 1-10, or 1-8 carbon atoms, and more preferably includes methyl, ethyl, isopropyl, or tert-butyl. The aryl preferably includes $C_5$-$C_6$ aryls or fluorenyl that can be substituted again or unsubstituted. The heteroaryl preferably includes heteroaryl containing at least one nitrogen atom, and more preferably includes pyridyl. The aryl most preferably includes $C_5$-$C_6$ aryls containing a substituent selected from F, methyl, and tert-butyl, or optionally substituted with at least one of the above substituents. The $C_5$-$C_6$ aryls more preferably contain 0, 1, or 2 of the above substituents, and most preferably include unsubstituted or substituted phenyl, such as biphenyl and phenyl preferably substituted with two tert-butyls at interposition.

The unsaturated alkyl containing 1-20 C atoms preferably includes alkenyl, more preferably includes alkenyl containing a double bond, and most preferably includes alkenyl containing a double bond and 1-8 carbon atoms.

The above-mentioned alkyl includes alkyl containing 1-30 carbon atoms, preferably 1-10 carbon atoms, and more preferably 1-4 carbon atoms. The alkyl may be branched, linear-chained, or annular, and may be separated by one or more of heteroatoms, preferably N, O, or S. Furthermore, the alkyl may be substituted with one or more of halogens or the above-mentioned substituents with respect to the aryl. Similarly, the alkyl is possible to have one or more of aryls, and all the above-mentioned aryls are suitable for this objective. The alkyl is more preferably selected from methyl, ethyl, isopropyl, n-propyl, isobutyl, n-butyl, tert-butyl, sec-butyl, isopentyl, cyclopropyl, cyclopentyl, and cyclohexyl.

The above-mentioned acyl is connected to a CO group by a single bond, such as the alkyl used herein.

The above-mentioned alkoxy is directly connected to oxygen by a single bond, such as the alkyl used herein.

The above-mentioned heteroaryl is considered to be associated with the aromatic group and $C_3$-$C_8$ ring groups, and contain an oxygen or sulfur atom, 1-4 nitrogen atoms or a combination of an oxygen or sulfur atom and at most two nitrogen atoms, and derivatives substituted therewith and benzo-pyridino condensed derivatives. For example, the heteroaryl connected by a ring-forming carbon atom may be substituted with one or more of the above-mentioned substituents with respect to the aryl.

In some embodiments, the heteroaryl may be a five-membered or six-membered heterocyclic aromatic system containing 0, 1, or 2 of the above-mentioned independent substituents. Typical examples of the heteroaryl include, but are not limited to, unsubstituted furan, benzofuran, thiophene, benzothiophene, pyrrole, pyridine, indole, azole, benzoxazole, isozole, benzoisazole, thiazole, benzothiazole, isothiazole, imidazole, benzimidazole, pyrazole, indazole, tetrazole, quinoline, isoquinoline, pyridazine, pyrimidine, purine, pyrazine, furan, 1,2,3-diazole, 1,2,3-thiadiazole, 1,2,4-thiadiazole, triazole, benzotriazole, pteridine, benzoxazole, diazole, benzopyrazole, quinazine, cinnoline, phthalazine, quinazole, quinazoline, and mono-substituted or di-substituted derivatives thereof. In some embodiments, a substituent includes halide, hydroxyl, cyano, 0-$C_{1-6}$ alkyl, $C_{1-6}$ alkyl, hydroxyl $C_{1-6}$ alkyl, and amino $C_{1-6}$ alkyl.

Specific examples shown below include, but are not limited to the following structures:

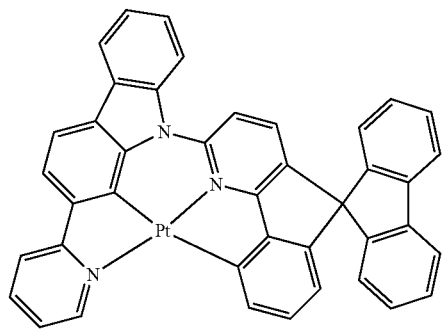

Pt-1

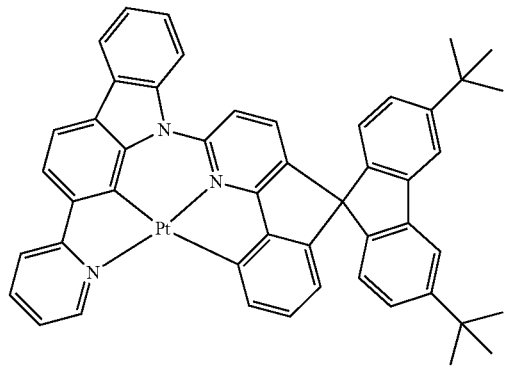

Pt-2

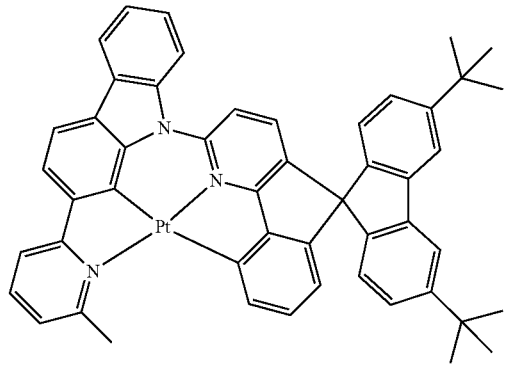

Pt-3

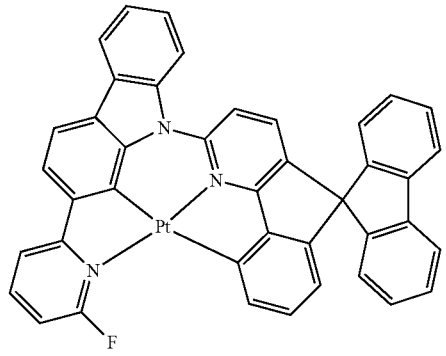

Pt-4

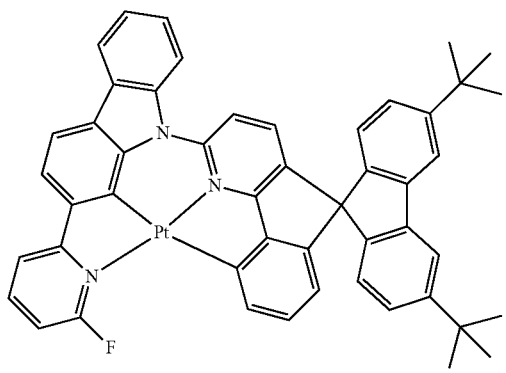
Pt-5
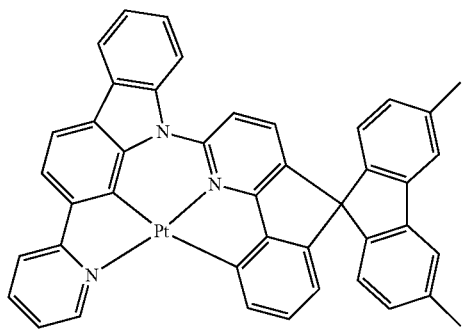
Pt-6
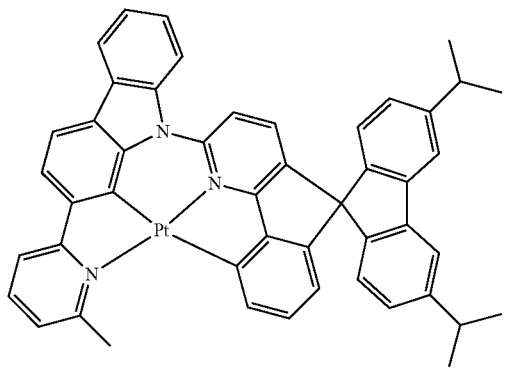
Pt-7
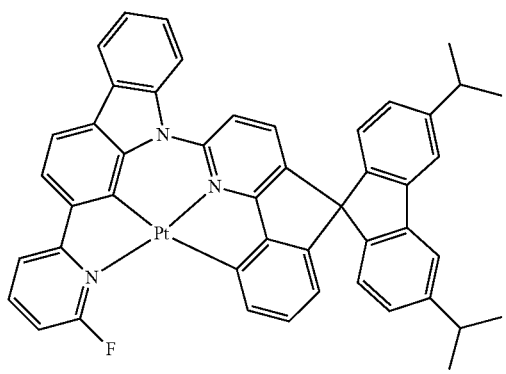
Pt-8
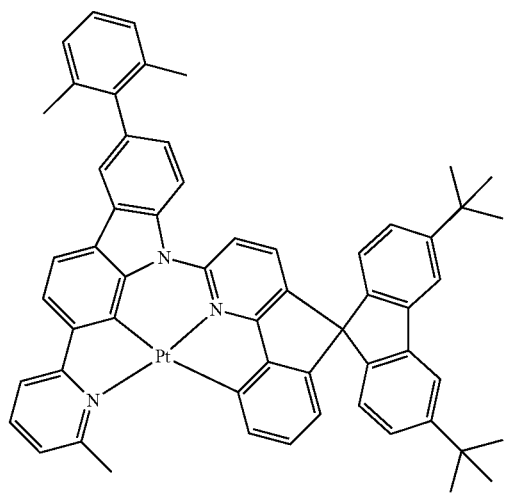
Pt-9
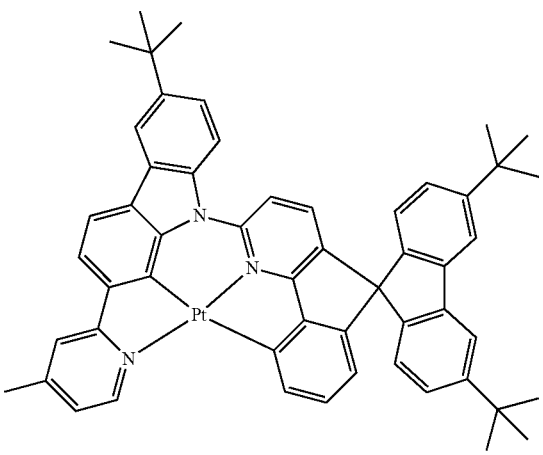
Pt-10
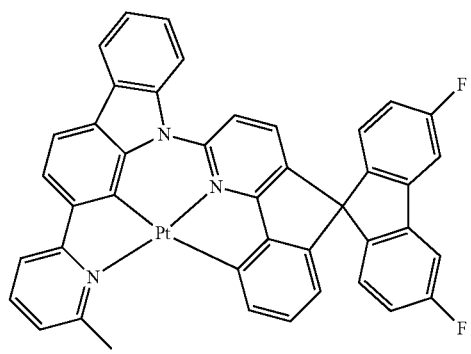
Pt-11

Pt-12

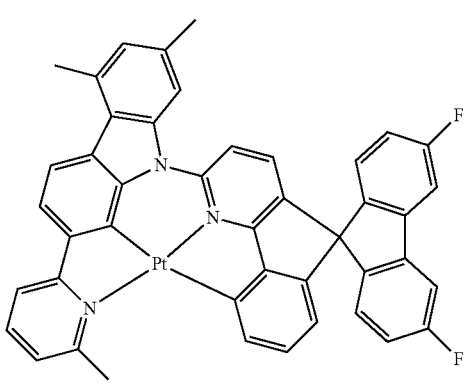

Pt-13

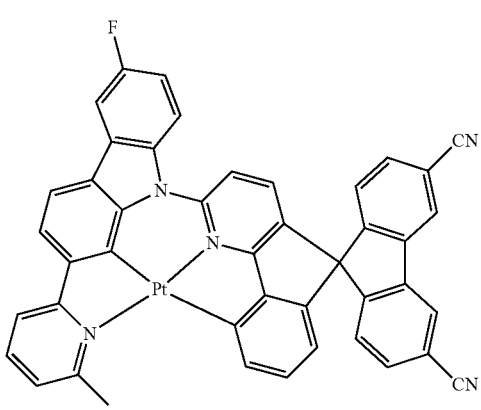

Pt-14

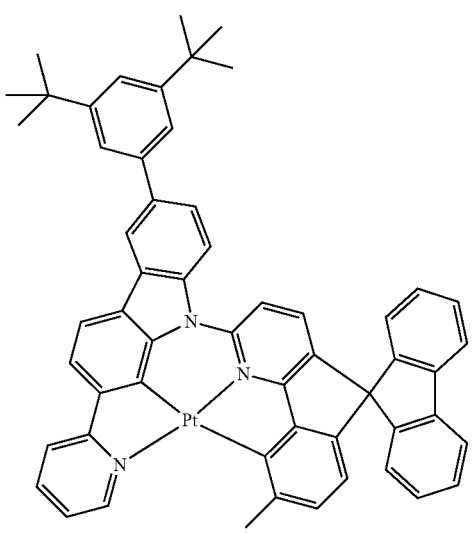

Pt-15

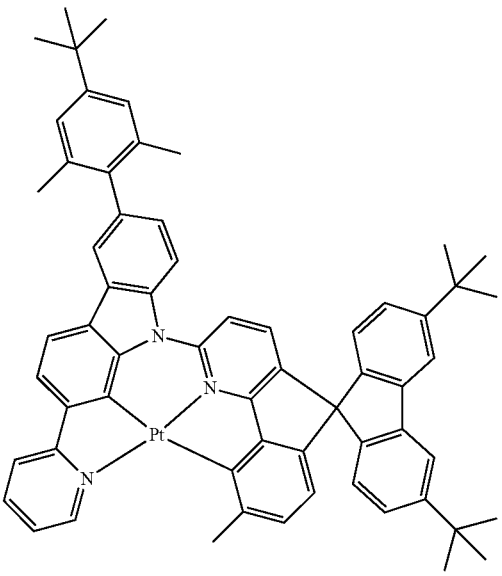

Application of the above complex in an OLED light-emitting device is provided.

An OLED device using the platinum (II) complex with the above-mentioned structure is provided.

An organic light-emitting device containing one or more of the above-mentioned complexes is included.

The complex is applied in the form of a layer in the device by thermal deposition.

The complex is applied in the form of a layer in the device by spin coating.

The complex is applied in the form of a layer in the device by ink-jet printing.

The above-mentioned complex is used as a phosphorescent doping material with a photon emission effect in a light-emitting layer.

The organic light-emitting device has an orange red emission when an electric current is applied.

The organic metal complex of the present invention has high fluorescence quantum efficiency, great thermal stability and low quenching constant, and can be used for manufacturing an orange red-light OLED device with high luminescence efficiency and low roll-off.

BRIEF DESCRIPTION OF DRAWINGS

FIG. 1 a structural schematic diagram of an organic electroluminescent device of the present invention.

DETAILED DESCRIPTION OF EMBODIMENTS

The present invention is further described in detail with reference to embodiments.

A method for preparing the above-mentioned complex includes the following steps.

As shown below, initial substrates S1 and S2 undergo a Suzuki coupling reaction to obtain a substrate S3. The S3 and S4 undergo a Buchwald-Hartwig coupling reaction to obtain a substrate S5. The S5 and S6 undergo a reaction to obtain a substrate S7. The S7 and $K_2PtCl_4$ undergo a chelating reaction to obtain the target platinum (II) complex TM.

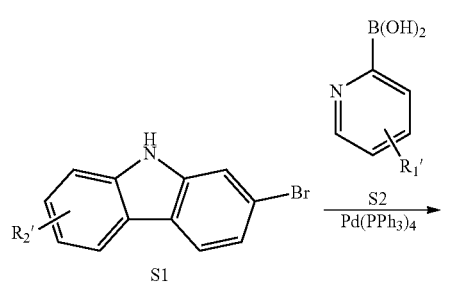
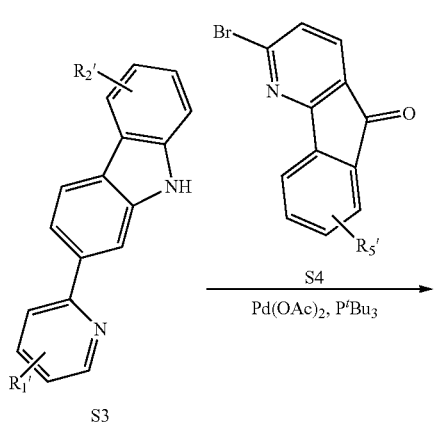
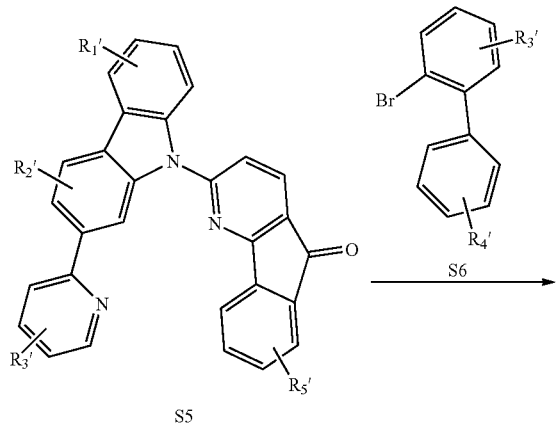
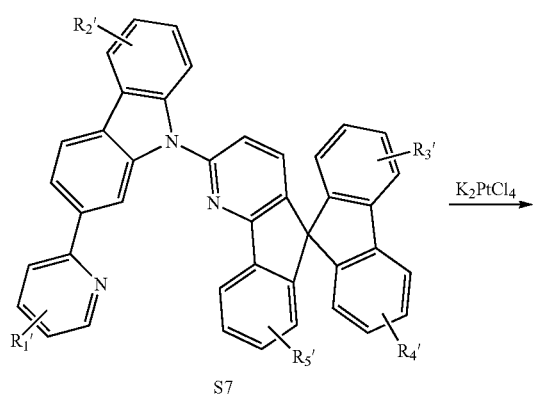
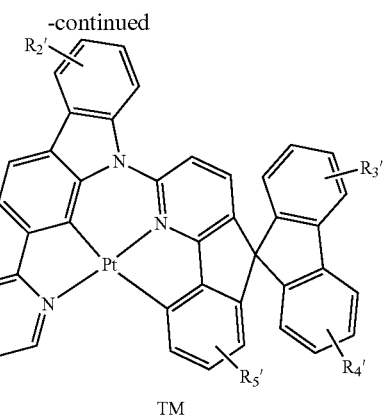
All reagents such as initial substrates, intermediates and solvents involved in the synthesis of compounds in the present invention were purchased from Energy Chemical, J&K Scientific, Aladdin, and other suppliers known to persons skilled in the art.
Example 1
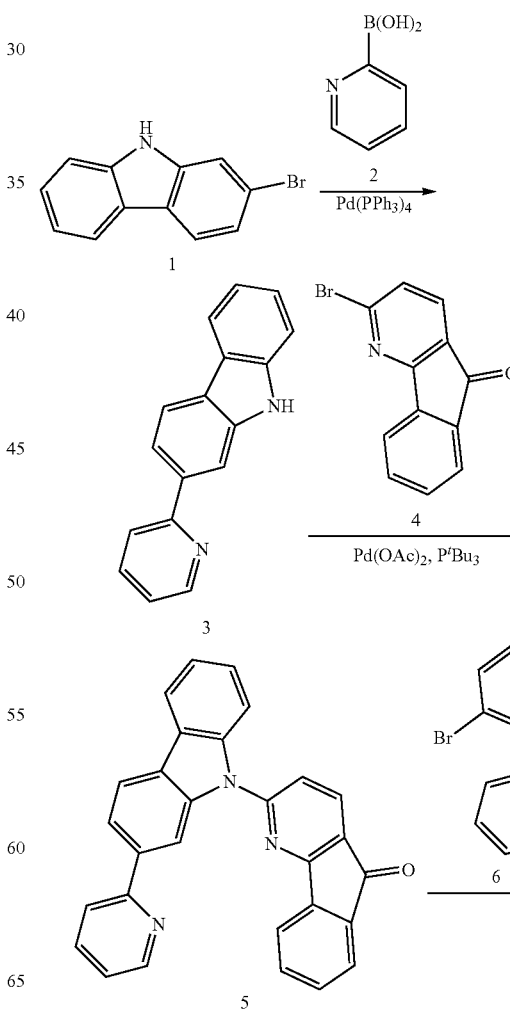

-continued

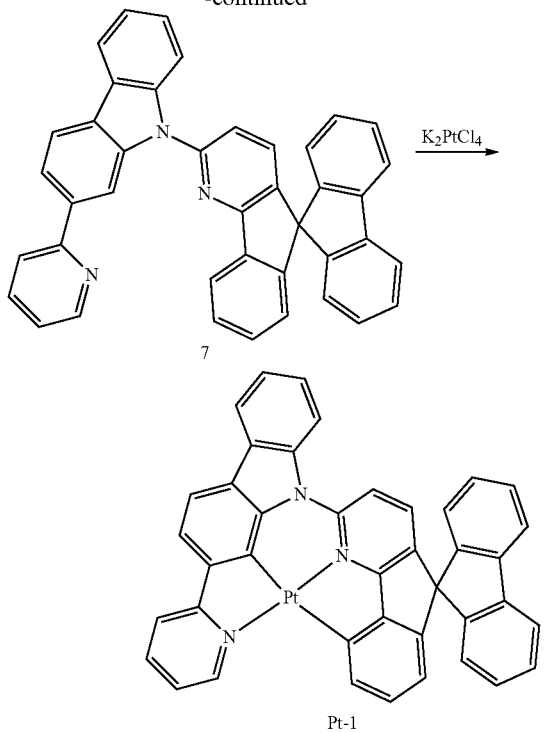

Synthesis of a compound 3: 24.6 g (0.10 mol) of a compound 1, 14.8 g (0.12 mol) of a compound 2, 3.46 g (0.03 eq., 3.0 mmol) of tetra-(triphenylphosphine) palladium, and 27.6 g (2.0 eq., 0.20 mol) of potassium carbonate were put into a flask, and then 150 mL of dioxane and 50 mL of water were added for a reaction by heating reflux for 8 hours under the protection of nitrogen. After the reaction was stopped, cooling was conducted to room temperature, and rotary evaporation was conducted to remove the solvent. Appropriate amounts of water and ethyl acetate were added for extraction, and an organic phase was collected and dried. After the solvent was removed by rotary evaporation, separation was conducted by using a silica gel flash chromatography column (a mobile phase includes n-hexane and ethyl acetate at a ratio of 10:1), and then recrystallization was conducted to obtain 21.0 g of a target product compound 3 with a yield of 86% and a purity of 99.9%.

Synthesis of a compound 5: 12.2 g (50 mmol) of the compound 3, 13.0 g (50 mmol) of a compound 4, 450 mg (0.04 eq., 2 mmol) of palladium acetate, 0.40 g (0.08 eq., 4 mmol) of tri-tert-butylphosphine, and 11.22 g (2.0 eq., 0.10 mol) of potassium tert-butoxide were put into a flask, and then 150 mL of toluene was added for a reaction by heating reflux for 8 hours under the protection of nitrogen. After the reaction was stopped, cooling was conducted to room temperature, and rotary evaporation was conducted to remove the solvent. Appropriate amounts of water and ethyl acetate were added for extraction, and an organic phase was collected and dried. After the solvent was removed by rotary evaporation, separation was conducted by using a silica gel flash chromatography column (a mobile phase includes n-hexane and ethyl acetate at a ratio of 10:1), and then recrystallization was conducted to obtain 17.6 g of a target product compound 5 with a yield of 83% and a purity of 99.9%.

Synthesis of a compound 7: 8.5 g (20 mmol) of the compound 5, 4.7 g (20 mmol) of a compound 6, 225 mg (0.02 eq., 1 mmol) of palladium acetate, 0.20 g (0.04 eq., 2 mmol) of tri-tert-butylphosphine, and 4.5 g (2.0 eq., 0.04 mol) of potassium tert-butoxide were put into a flask, and then 100 mL of toluene was added for a reaction by heating reflux for 8 hours under the protection of nitrogen. After the reaction was stopped, cooling was conducted to room temperature, and rotary evaporation was conducted to remove the solvent. Appropriate amounts of water and ethyl acetate were added for extraction, and an organic phase was collected and dried. After the solvent was removed by rotary evaporation, a crude product was obtained, dissolved in 50 mL of acetic acid and 10 mL of concentrated sulfuric acid, and then heated to 80° C. for a reaction for 3 hours. After the reaction was stopped, cooling was conducted to room temperature, and 200 mL of water was added to the system to precipitate a product. The product was filtered to obtain a crude product. Separation was conducted by using a silica gel flash chromatography column (a mobile phase includes n-hexane and ethyl acetate at a ratio of 10:1), and then recrystallization was conducted to obtain 6.7 g of a target product compound 7 with a yield of 60% and a purity of 99.9%.

Synthesis of a compound Pt-1: 1.2 g (2.0 mmol) of the compound 7, 160 mg (0.25 eq., 0.5 mmol) of tetrabutylammonium bromide, and 930 mg (1.2 eq., 2.4 mmol) of potassium tetrachloroplatinate were dissolved in 50 mL of acetic acid, vacuumization was conducted, nitrogen was introduced for replacement several times, and then stirring heating was conducted to 130° C. for a reaction for 12 hours. After the reaction was stopped, cooling and rotary evaporation were conducted to remove the solvent. Appropriate amounts of water and ethyl acetate were added for extraction, an organic phase was collected and dried with anhydrous magnesium sulfate, and then the solvent was removed by rotary evaporation. Separation was conducted by using a silica gel flash chromatography column (a mobile phase includes n-hexane and dichloromethane at a ratio of 10:1), and then recrystallization with methanol was conducted to obtain a crude product. The crude product obtained was sublimated under vacuum to obtain 550 mg of a red solid with a total yield of 33% and a purity of 99.95%. Based on mass spectrometry (ESP) ([M+H]$^-$), a theoretical value of $C_{41}H_{23}N_3OPt$ was 752.15; and a measured value was 752.10.

Example 2

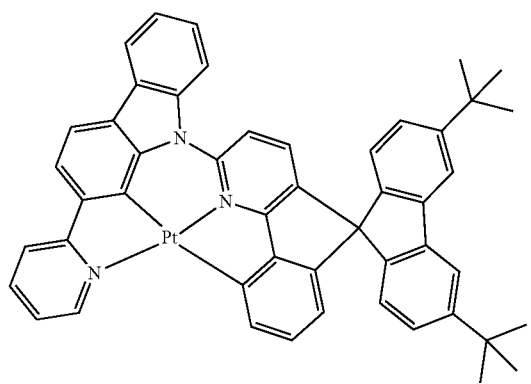

A method for preparing Pt-2 was the same as the synthesis route of the Pt-1, except that a compound 9 was used to replace the compound 6. A molecular formula of the compound 9 is shown as follows:

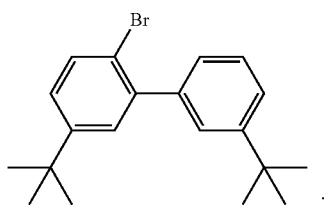

(Compound 9)

Example 3

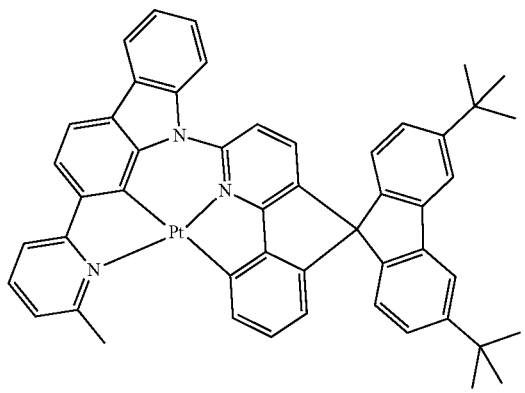

Pt-3

A method for preparing Pt-3 was the same as the synthesis route of the Pt-1, except that a compound 9 and a compound 10 were used to replace the compound 6 and the compound 2, respectively. A molecular formula of the compound 10 is shown as follows:

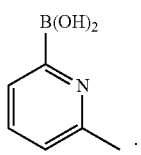

(Compound 10)

An application example of the compound of the present invention is described below.

ITO/TAPC (70 nm)/TCTA:Pt (II) (40 nm)/TmPyPb (30 nm)/LiF (1 nm)/Al (90 nm)

A method for preparing a device is as follows.

A transparent anode indium tin oxide (ITO) (10 Ω/sq) glass substrate was ultrasonically cleaned with acetone, ethanol, and distilled water in sequence, and then treated with oxygen plasma for 5 minutes.

Next, the ITO substrate was installed on a substrate fixator of a vacuum gas phase evaporation apparatus. The system pressure of the evaporation apparatus was controlled at $10^{-6}$ torr.

After that, TAPC, as a material for a hole transport layer (HTL), was evaporated on the ITO substrate and had a thickness of 70 nm.

Then, TCTA, as a material for a light-emitting layer (EML), was evaporated and had a thickness of 40 nm, in which a platinum (II) complex with a mass fraction of 10% was doped.

Then, TmPyPb, as a material for an electron transport layer (ETL), was evaporated and had a thickness of 30 nm.

Then, LiF with a thickness of 1 nm was evaporated as an electron injection layer (EIL).

At last, Al with a thickness of 90 nm was evaporated as a cathode, and a device was packaged, as shown in FIG. 1.

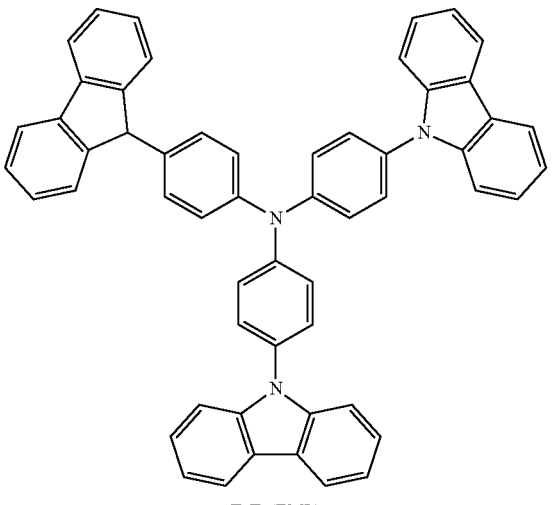

TAPC(HIL)

TcTa(EML)

-continued

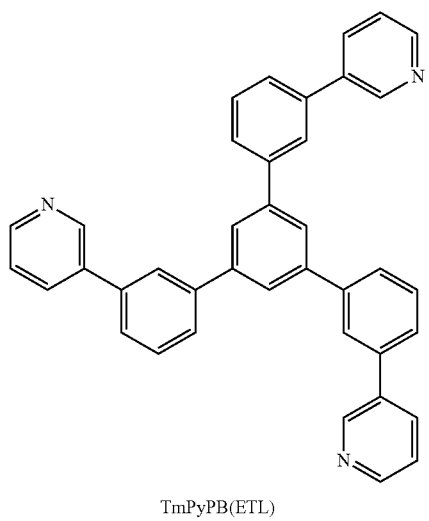

TmPyPB(ETL)

A device 1, a device 2, and a device 3 were prepared in sequence. Structures and manufacturing methods of the devices were exactly the same, except that the platinum (II) complexes Pt-1, Pt-2, and Pt-3 were sequentially used as a dopant in the light-emitting layer.

| Entry | Voltage (V) | Brightness (cd/m$^2$) | Current efficiency (cd/A) | Power efficiency (lm/W) | EQE (%) | $\lambda_m$ (nm) |
|---|---|---|---|---|---|---|
| Pt-1 | 3.87 | 9450 | 38.10 | 35.13 | 9.07 | 617 |
| Pt-2 | 3.78 | 9680 | 39.60 | 36.78 | 9.76 | 618 |
| Pt-3 | 3.72 | 9850 | 40.20 | 38.39 | 10.91 | 618 |

As shown in the above table, all the organic electroluminescent devices prepared based on the platinum (II) complexes of the present invention have great luminescence properties, in which the device prepared based on the Pt-3 has the best properties including the maximum brightness of 9,850 cd/m$^2$, the maximum current efficiency of 40.20 cd/A, the maximum power efficiency of 38.39 lm/W, and the maximum external quantum efficiency of 10.91%. Such novel Pt (II) complex of the present invention has NCNC chelating coordination among molecules, a stable structure, a spiro ring structure in the skeleton, a strong molecular stereoscopic property, and weak intermolecular interaction, so that mutual stacking between complex molecules is avoided, the formation of an excimer is greatly inhibited, and thus the efficiency of an OLED device is improved. In summary, compared with a reference device, the properties of an organic electroluminescent device prepared in the present invention are greatly improved, and the novel quadridentate platinum (II) complex metal-organic material involved has a great application value.

The invention claimed is:

1. A quadridentate platinum (II) complex, having the structure as shown in the following formula:

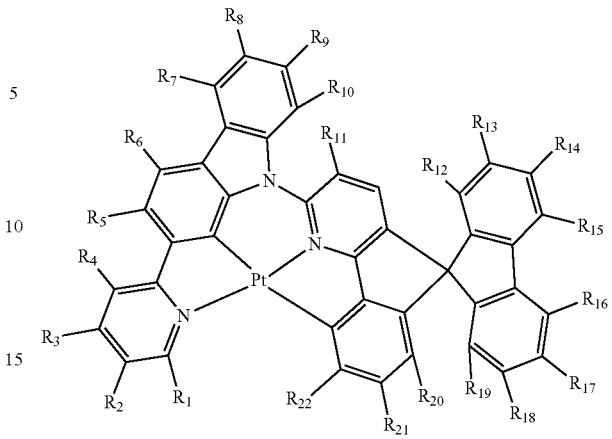

wherein $R_1$-$R_{22}$ are independently selected from hydrogen, deuterium, sulfur, halogen, hydroxyl, acyl, alkoxy, acyloxy, amino, nitro, acyl amino, cyano, carboxyl, styryl, amino carbonyl, carbamoyl, benzyl carbonyl, aryloxy, diarylamino, saturated alkyl containing 1-30 C atoms, unsaturated alkyl containing 2-20 C atoms, substituted or unsubstituted aryl containing 5-30 C atoms, and substituted or unsubstituted heteroaryl containing 5-30 C atoms; or adjacent $R_1$-$R_{21}$ are mutually connected into a ring by a covalent bond; the substituted refers to substitution with halogen, deuterium, $C_1$-$C_{20}$ alkyls, $C_1$-$C_{10}$ silyls, and cyano; and a heteroatom in the heteroaryl comprises one or more of N, O, and S.

2. The complex according to claim 1, wherein the $R_1$-$R_{21}$ are independently selected from hydrogen, halogen, amino, nitro, cyano, diarylamino, saturated alkyl containing 1-10 C atoms, aryl containing 5-20 C atoms unsubstituted or substituted with halogen or one or more of $C_1$-$C_4$ alkyls, and heteroaryl containing 5-20 C atoms unsubstituted or substituted with halogen or one or more of $C_1$-$C_4$ alkyls; or adjacent $R_1$-$R_{21}$ are mutually connected into a ring by a covalent bond; and the halogen comprises F, Cl, and Br.

3. The complex according to claim 2, wherein among 22 groups, namely the $R_1$-$R_{22}$, 0-3 groups are independently represented as diarylamino, aryl containing 5-10 C atoms unsubstituted or substituted with halogen or 1-3 $C_1$-$C_4$ alkyls, and N-heteroaryl containing 5-10 C atoms unsubstituted or substituted with halogen or 1-3 $C_1$-$C_4$ alkyls; the other groups are independently represented as hydrogen or saturated alkyl containing 1-8 C atoms; and the halogen comprises F and Cl.

4. The complex according to claim 3, wherein among the 22 groups, namely the $R_1$-$R_{22}$, 0-3 groups are independently represented as diphenylamino, phenyl unsubstituted or substituted with halogen or 1-3 $C_1$-$C_4$ alkyls, pyridyl unsubstituted or substituted with halogen or 1-3 $C_1$-$C_4$ alkyls, and carbazolyl unsubstituted or substituted with halogen or 1-3 $C_1$-$C_4$ alkyls; and the other groups are independently represented as hydrogen, fluorine, or saturated alkyl containing 1-4 C atoms.

5. The complex according to claim 1, having the structure as shown in the following formula:

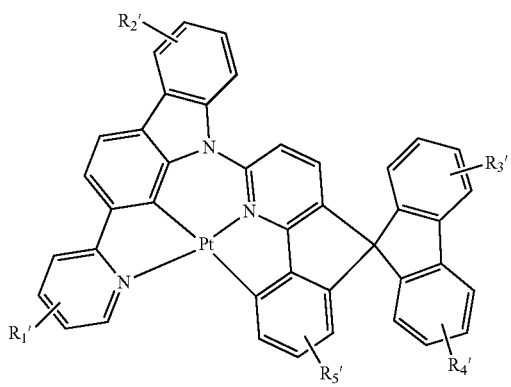

wherein $R_1'$-$R_5'$ are independently selected from hydrogen, halogen, diarylamino, saturated alkyl containing 1-10 C atoms, aryl containing 5-20 C atoms unsubstituted or substituted with halogen or one or more of $C_1$-$C_4$ alkyls, and heteroaryl containing 5-20 C atoms unsubstituted or substituted with halogen or one or more of $C_1$-$C_4$ alkyls; or adjacent $R_1'$-$R_5'$ are mutually connected into a ring by a covalent bond; the halogen comprises F, Cl, and Br; and a heteroatom in the heteroaryl comprises any one of N, O, and S.

6. The complex according to claim 5, wherein among 5 groups, namely the 0-3 groups are independently represented as diarylamino, aryl containing 5-10 C atoms unsubstituted or substituted with halogen or 1-3 $C_1$-$C_4$ alkyls, and heteroaryl containing 5-10 C atoms unsubstituted or substituted with halogen or 1-3 $C_1$-$C_4$ alkyls; the other groups are independently represented as hydrogen, halogen, or saturated alkyl containing 1-8 C atoms; and the halogen comprises F and Cl.

7. The complex according to claim 6, wherein among the 5 groups, namely the $R_1'$-$R_5'$, 0-3 groups are independently represented as diphenylamino, phenyl unsubstituted or substituted with $C_1$-$C_4$ alkyls, pyridyl unsubstituted or substituted with $C_1$-$C_4$ alkyls, and carbazolyl unsubstituted or substituted with $C_1$-$C_4$ alkyls; and the other groups are independently represented as hydrogen, fluorine, or saturated alkyl containing 1-4 C atoms.

8. The complex according to claim 1, having one of the following structures:

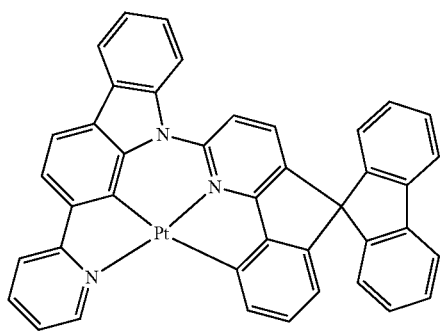

Pt-1

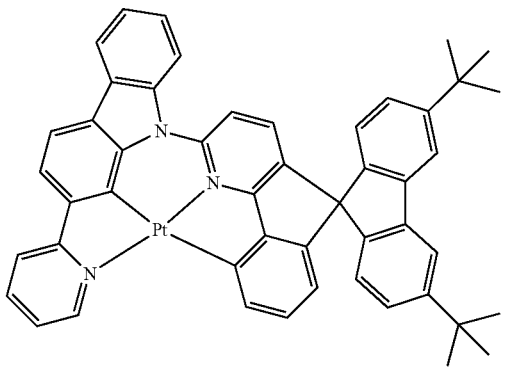

Pt-2

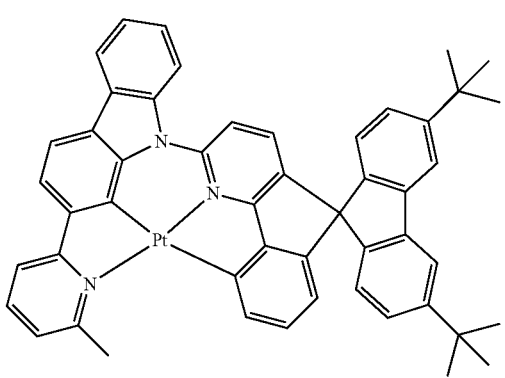

Pt-3

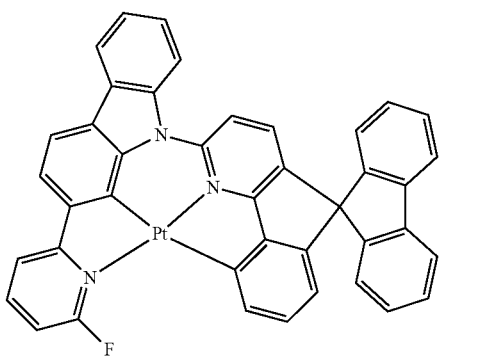

Pt-4

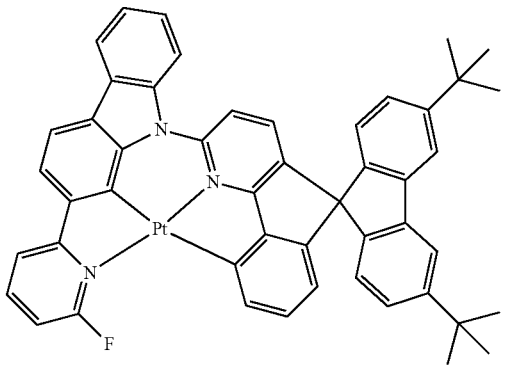

Pt-5

-continued
Pt-6
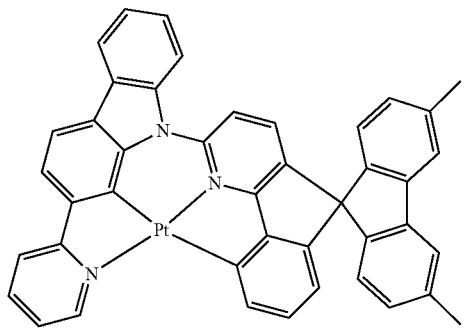
Pt-7
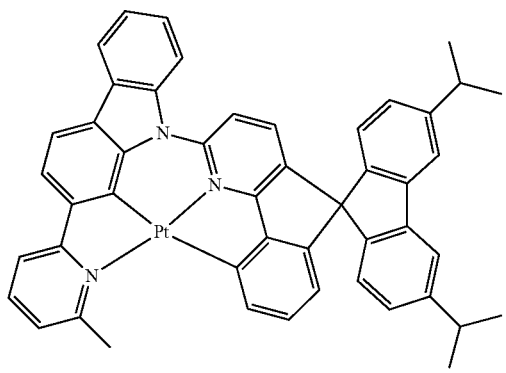
Pt-8
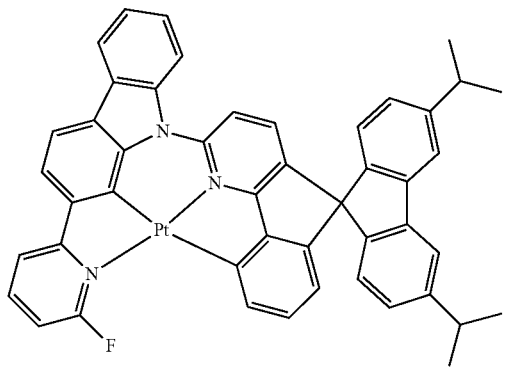
Pt-9
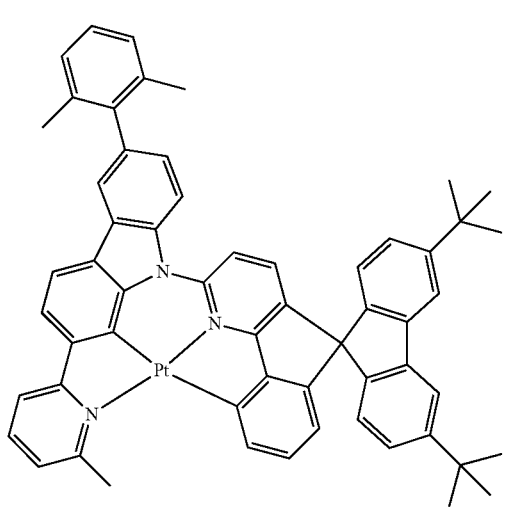
Pt-10
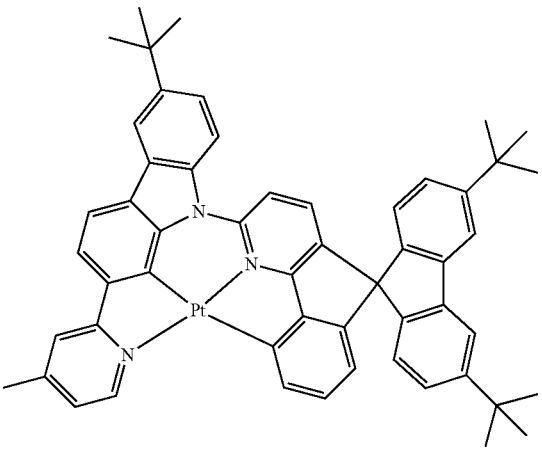
Pt-11
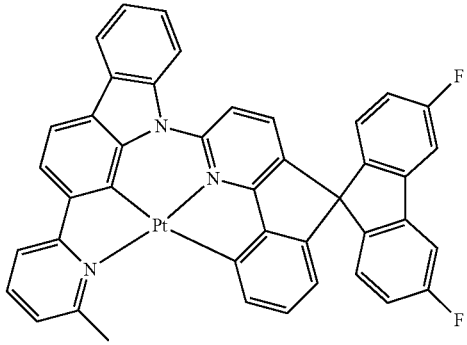
Pt-12
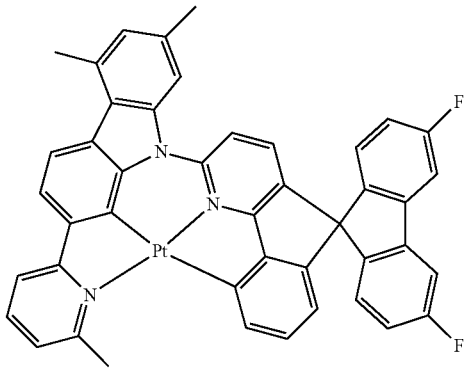

Pt-13

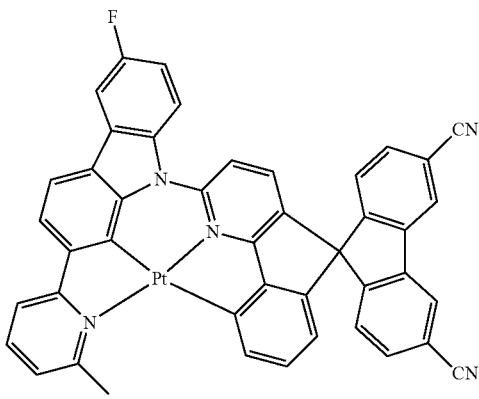

Pt-14

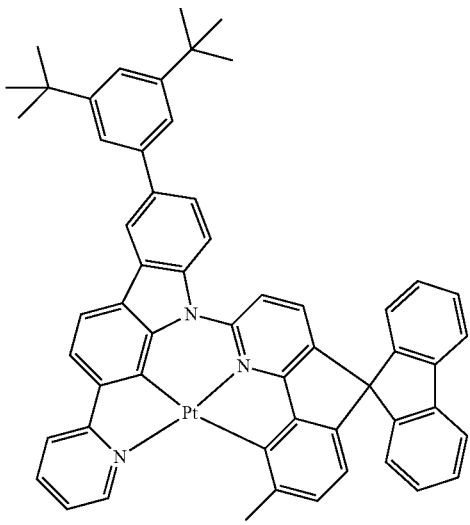

Pt-15

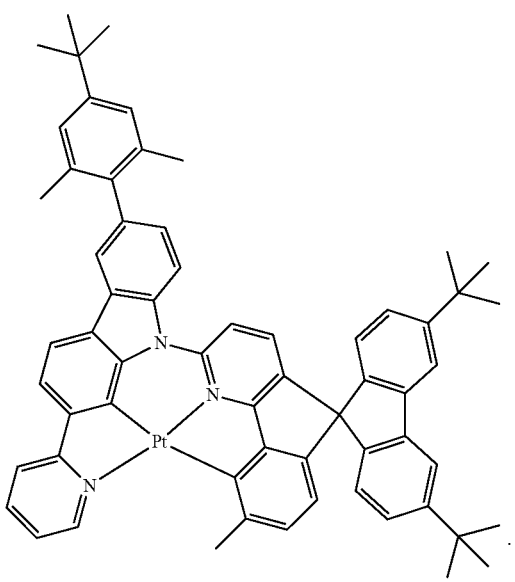

9. A precursor, that is ligand, of the complex according to any one of claims 1 to 8, having the following structural formula:

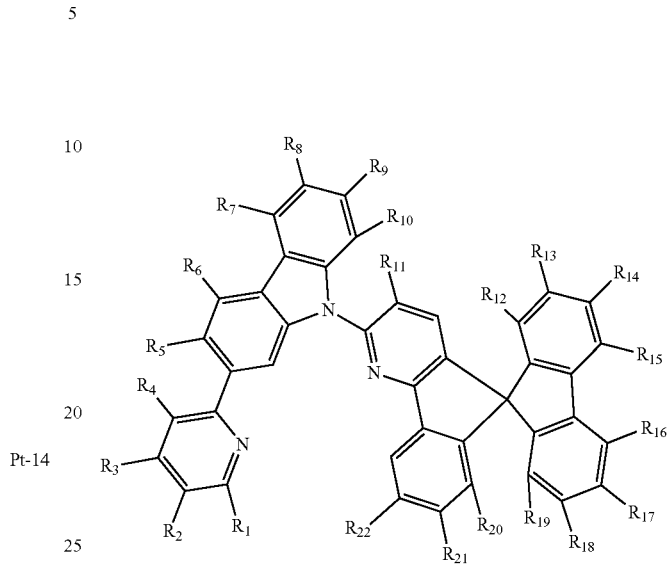

wherein $R_1$-$R_{22}$ are independently selected from hydrogen, deuterium, sulfur, halogen, hydroxyl, acyl, alkoxy, acyloxy, amino, nitro, acyl amino, cyano, carboxyl, styryl, amino carbonyl, carbamoyl, benzyl carbonyl, aryloxy, diarylamino, saturated alkyl containing 1-30 C atoms, unsaturated alkyl containing 2-20 C atoms, substituted or unsubstituted aryl containing 5-30 C atoms, and substituted or unsubstituted heteroaryl containing 5-30 C atoms; or adjacent $R_1$-$R_{21}$ are mutually connected into a ring by a covalent bond; the substituted refers to substitution with halogen, deuterium, $C_1$-$C_{20}$ alkyls, $C_1$-$C_{10}$ silyls, and cyano; and a heteroatom in the heteroaryl comprises one or more of N, O, and S.

10. A method for synthesizing the quadridentate platinum (II) complex according to claim 5, comprising the following steps:

subjecting initial substrates S1 and S2 to a Suzuki coupling reaction to obtain a substrate S3; subjecting the S3 and S4 to a Buchwald-Hartwig coupling reaction to obtain a substrate S5; subjecting the S5 and S6 to a reaction to obtain a substrate S7; and subjecting the S7 and $K_2PtCl_4$ to a chelating reaction to obtain the target platinum (II) complex TM.

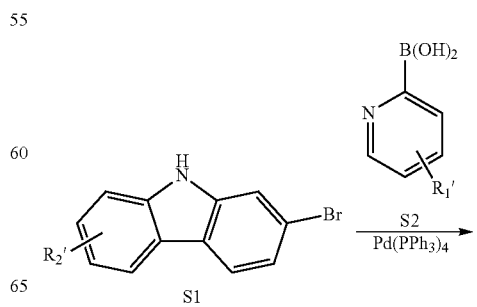

-continued
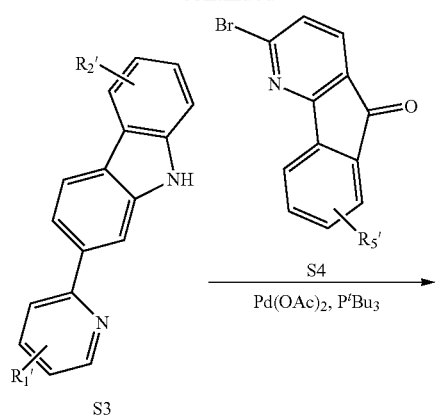
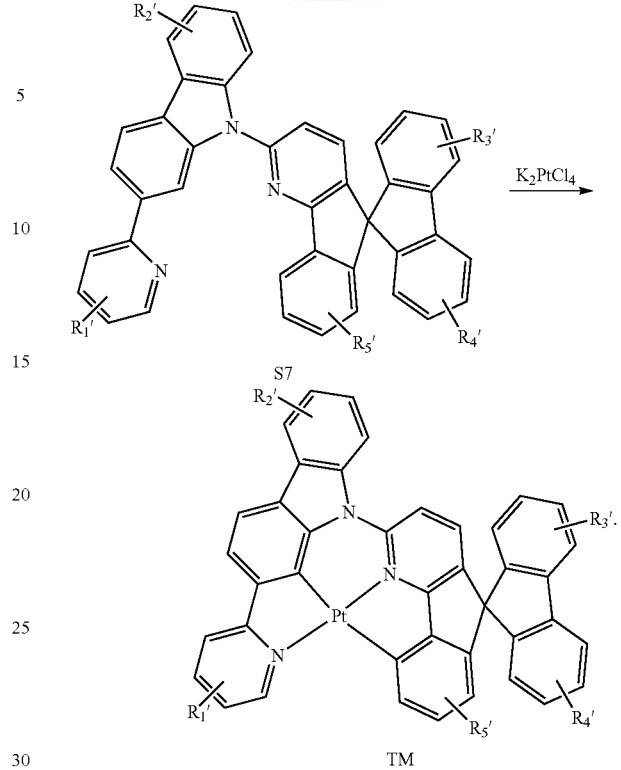
11. Application of the complex according to any one of claims 1 to 8 in an OLED light-emitting device.
12. The application according to claim 11, wherein the complex according to any one of claims 1 to 8 is used as a phosphorescent doping material with a photon emission effect in a light-emitting layer.
* * * * *